United States Patent
Kim et al.

(10) Patent No.: US 7,031,201 B2
(45) Date of Patent: Apr. 18, 2006

(54) SEMICONDUCTOR MEMORY DEVICE WITH LATE WRITE FUNCTION AND DATA INPUT/OUTPUT METHOD THEREFOR

(75) Inventors: Sung-Ryul Kim, Gyeonggi-do (KR); Dae-Hee Jung, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/005,544

(22) Filed: Dec. 6, 2004

(65) Prior Publication Data

US 2005/0135160 A1    Jun. 23, 2005

(30) Foreign Application Priority Data

Dec. 19, 2003    (KR) .................... 10-2003-0093834

(51) Int. Cl.
*G11C 7/00* (2006.01)

(52) U.S. Cl. .............................. 365/189.05; 365/189.02

(58) Field of Classification Search ..................... None
See application file for complete search history.

(56) References Cited

U.S. PATENT DOCUMENTS

| | | | | |
|---|---|---|---|---|
| 5,251,181 A | * | 10/1993 | Toda | .............. 365/230.08 |
| 5,293,347 A | * | 3/1994 | Ogawa | .............. 365/230.01 |
| 5,307,324 A | * | 4/1994 | Nishimoto | .............. 365/233.5 |
| 5,311,469 A | * | 5/1994 | Hoshi et al. | .............. 365/189.05 |
| 5,717,653 A | | 2/1998 | Suzuki | |
| 5,784,331 A | * | 7/1998 | Lysinger | .............. 365/230.06 |
| 5,867,447 A | * | 2/1999 | Koshikawa | .............. 365/233 |
| 6,252,819 B1 | * | 6/2001 | Voss | .............. 365/230.06 |
| 2002/0149971 A1 | | 10/2002 | Takabashi et al. | |

FOREIGN PATENT DOCUMENTS

KR    1020020074993 A    10/2002

* cited by examiner

*Primary Examiner*—Tan T. Nguyen
(74) *Attorney, Agent, or Firm*—Myers Bigel Sibley & Sajovec

(57) ABSTRACT

An integrated circuit memory device includes a memory cell array, a plurality of data input lines configured to convey data to the memory cell array and a plurality of data output lines configured to convey data from the memory cell array. The device also includes a memory write buffer that receives write data for the memory cell array and responsively drives the data input lines, a sense amplifier and a plurality of sense amplifier input lines configured to convey data to the sense amplifier. The device further includes a selecting circuit coupled to the data input lines, to the data output lines and to the sense amplifier input lines and configured to selectively couple the data input lines to the sense amplifier input lines responsive to a control signal.

11 Claims, 5 Drawing Sheets

SEMICONDUCTOR MEMORY DEVICE WITH LATE WRITE FUNCTION AND DATA INPUT/OUTPUT METHOD THEREFOR

RELATED APPLICATION

This application claims the priority of Korean Patent Application No. 2003-93834 filed on Dec. 19, 2003, the contents of which are herein incorporated by reference in its entirety.

BACKGROUND OF THE INVENTION

The present invention relates to integrated circuit memory devices and more particularly, to memory devices having buffered write circuits and methods of operation thereof.

FIG. 1 is a block diagram showing a conventional synchronous-type static random access memory (SRAM) having a late write function. A synchronous-type SRAM is described in Korean Laid-Open Patent Application No. 2002-0074993.

Referring to FIG. 1, the SRAM device includes a data input register 12. The data input register 12 latches burst data and transfers the latched data to a write circuit 14 in response to control signals from a control circuit 10. The write circuit 14 receives the burst data from the data input register 12 and writes the received burst data into a memory cell array 16. A read circuit 18 reads the burst data from the memory cell array 16 and outputs the read burst data to an external device through an output buffer 20. In addition, the output buffer 20 outputs the latched data in the data input register 12 in case of a bypass read operation mode. The data input register 12 receives data from an external device and latches the received data in response to data input control signals DIN_CON_i_H. The latched data is output to the write circuit 14 in response to a flag signal Cell_Sel_H.

In the bypass read operation mode, the data is output from the data input register 12, not from the memory cell array 16, i.e., "bypassing" the memory cell array 16. The semiconductor memory device having the late write function as shown in FIG. 1 temporarily stores the data in the data input register 12 (i.e., a buffer cell) when a first write command is generated, and stores the data stored in the buffer cell into the memory cell array 16 when a second write command is generated. If the data is read before the data is stored in the memory cell array 16 (namely, before the next write command is generated), the data temporarily stored in the buffer cell is output to the external device. This operation is called a buffer read operation. A network DRAM applied to network equipment may also have a late write function.

In the above-described conventional semiconductor memory device, the data output path from the memory cell array 16 may be different from the path when the data is output from the buffer cell 12. That is, the data output from the memory cell array 16 may be amplified in an I/O sense amplifier and then is output to the external device, but the data output from the buffer cell 12 is output to the external device without passing through the I/O sense amplifier in the buffer read operation. Thus, if the data is output from the buffer cell, a reordering circuit may be required to reorder the output order of the data output from the buffer cell 12. If a reordering circuit is added to the semiconductor memory device so as to execute the buffer read operation, the number of tri-state buffers additionally required may be increased in proportion to the number of data output pins. In addition, additional wires for the semiconductor memory device may be required. As a result, chip size may increase and design cost for the chip may increase.

SUMMARY OF THE INVENTION

In some embodiments of the present invention, an integrated circuit memory device includes a memory cell array, a plurality of data input lines configured to convey data to the memory cell array and a plurality of data output lines configured to convey data from the memory cell array. The device also includes a memory write buffer that receives write data for the memory cell array and responsively drives the data input lines, a sense amplifier and a plurality of sense amplifier input lines configured to convey data to the sense amplifier. The device further includes a selecting circuit coupled to the data input lines, to the data output lines and to the sense amplifier input lines and configured to selectively couple the data input lines to the sense amplifier input lines responsive to a control signal.

The data output lines and the sense amplifier lines may include a plurality of signal line pairs extending from the memory cell array to the sense amplifier, and the selecting circuit may be configured to couple and decouple the data input lines to and from the plurality of signal line pairs. The signal line pairs extending from the memory cell array to the sense amplifier may include a first plurality of signal line pairs, and the data input lines may include a second plurality of signal line pairs extending between the memory write buffer and the memory cell array. The selecting circuit may be configured to couple and decouple single signal lines of respective ones of the second plurality of signal line pairs to and from the first plurality of signal line pairs. For example, the selecting circuit may include a first transistor configured to couple and decouple a signal line of the second plurality of signal lines to and from a first signal line of a pair of signal lines of the first plurality of signal line pairs, a second transistor configured to couple and decouple the signal line of the second plurality of signal lines to and from a second signal line of the pair of signal lines of the first plurality of signal line pairs, and an inverter configured to be coupled by the second transistor between the signal line of the second plurality of signal lines and the second signal line of the pair of signal lines of the first plurality of signal line pairs. In further embodiments, the selecting circuit may include a first transistor configured to couple and decouple a first signal line of the second plurality of signal lines to and from a first signal line of a pair of signal lines of the first plurality of signal line pairs and a second transistor configured to couple and decouple a second signal line of the second plurality of signal lines to and from a second signal line of the pair of signal lines of the first plurality of signal line pairs.

In additional embodiments of the present invention, methods of operation are provided for an integrated circuit memory device that includes a memory cell array that provides data to a sense amplifier via sense amplifier input lines and a memory write buffer that drives data input lines to the memory cell array. In some embodiments, the data input lines are selectively coupled to the sense amplifier input lines responsive to a control signal. The data output lines and the sense amplifier lines may include a plurality of signal line pairs extending from the memory cell array to the sense amplifier, and selectively coupling the data input lines to the sense amplifier input lines responsive to a control signal may include coupling and decoupling the data input lines to and from the plurality of signal line pairs.

DETAILED DESCRIPTION OF EXEMPLARY EMBODIMENTS

The present invention will now be described more fully with reference to the accompanying, in which embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. Like numbers refer to like elements. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
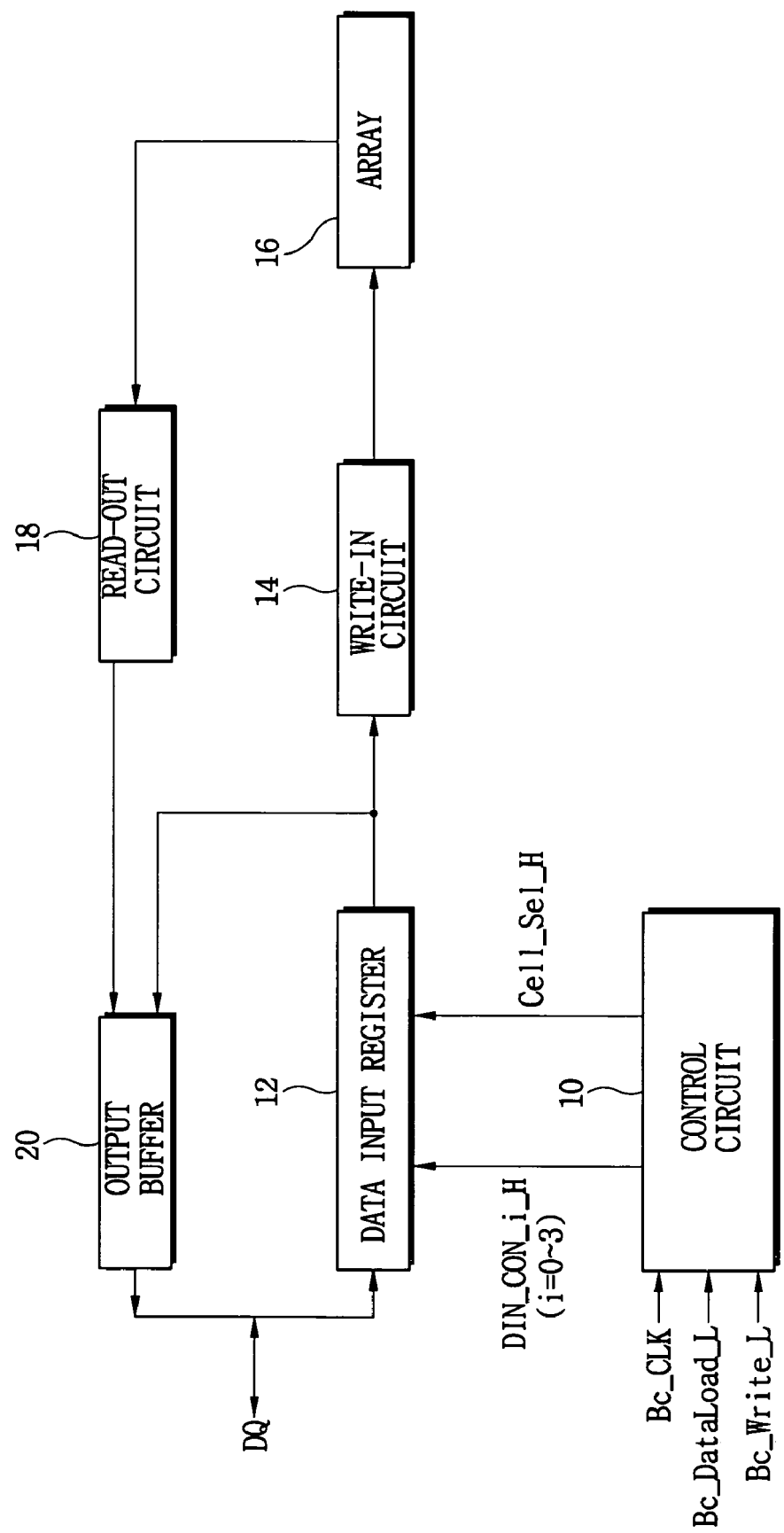
FIG. 1 is a block diagram showing a conventional synchronous-type static random access memory (SRAM) having a late write function.
Figure 2:
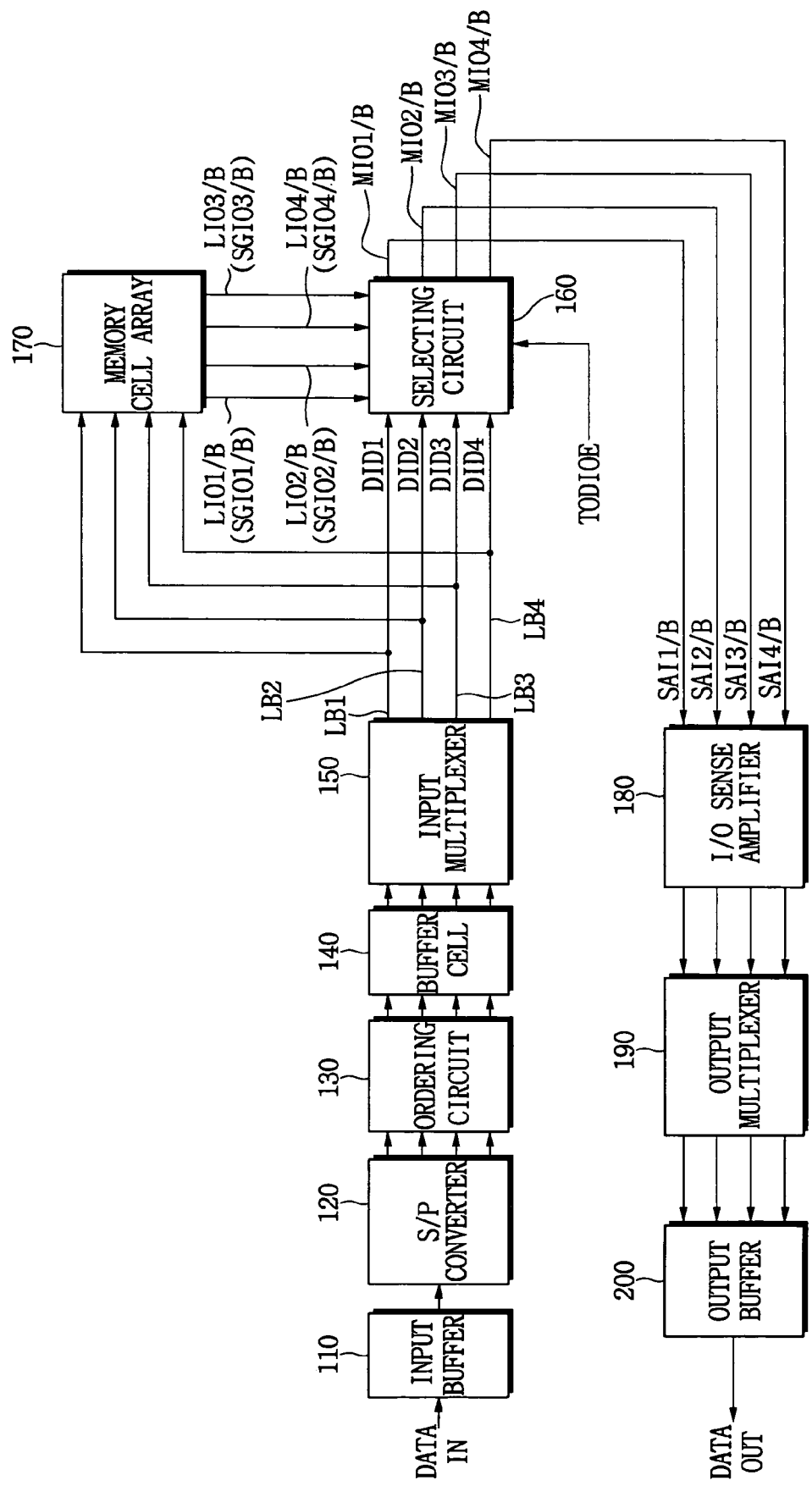
FIG. 2 is a block diagram showing input/output paths of a dynamic random access memory (DRAM) device having a late write function according to exemplary embodiments of the present invention.

FIG. 2 is a block diagram showing input/output paths of a dynamic random access memory (DRAM) device having a late write function according to some exemplary embodiments of the present invention.

Referring to FIG. 2, the semiconductor memory device includes an input buffer 110, an S/P converter 120, an ordering circuit 130, a buffer cell (memory write buffer) 140, an input multiplexer 150, a memory cell array 170, a selecting circuit 160, an I/O sense amplifier 180, an output multiplexer 190 and an output buffer 200. In FIG. 2, LI01/B and SGI01/B represents a pair of local input/output lines (LI01 and LI01B) and a pair of memory data (SGI01 and SGI01B), respectively. MI01/B represents a pair of main input/output lines (MI01 and MI01B).

The input buffer 110 receives data from an external device and buffers the received data in accordance with an operation level of a semiconductor chip. The S/P converter 120 converts serial data output from the input buffer 110 into parallel data. The ordering circuit 130 receives the parallel data from the S/P converter 120 and determines the order of data to be provided to the memory cell array 170 in response to an initial address.

The buffer cell 140 temporarily stores the data output from the ordering circuit 130 when a first write command is generated. The input multiplexer 150 outputs data from the buffer cell 140 to buffer output lines LB1, LB2, LB3 and LB4. The memory cell array 170 receives and stores the buffer data DID1, DID2, DID3 and DID4 output from the input multiplexer 150 when a next write command is generated. In addition, the memory cell array 170 outputs memory data pairs SGI01/B, SGI02/B, SGI03/B and SGI04/B to local input/output line pairs LI01/B, LI02/B, LI03/B and LI04/B during a read operation. During the read operation, the selecting circuit 160 selects either the buffer data DID1, DID2, DID3 and DID4 output from the input multiplexer 150 or the memory data pairs SGI01/B, SGI02/B, SGI03/B and SGI04/B output from the memory cell array 170 to output the buffer data DID1, DID2, DID3 and DID4 or the memory data pairs SGI01/B, SGI02/B, SGI03/B and SGI04/B to the main input/output line pairs MI01/B, MI02/B, MI03/B and MI04/B.

The I/O sense amplifier 180 amplifies output data pairs SAI1/B, SAI2/B, SAI3/B and SAI4/B output from the selecting circuit 160 to provide the amplified data to the output multiplexer 190. The output multiplexer 190 selectively outputs the amplified data output from the I/O sense amplifier 180.

Hereinafter, operation of the semiconductor memory device according to an exemplary embodiment of the present invention will be described with reference to FIG. 2.

In a data write operation, the data is buffered by the input buffer 110 in accordance with the operation level of the semiconductor chip. The buffered data is converted into parallel data by the S/P converter 120. The parallel data is provided to the ordering circuit 130, so that the input order of the data to be provided to the memory cell array 170 is determined by the ordering circuit 130 according to the initial address. The data output from the ordering circuit 130 are temporarily stored in the buffer cell 140 when the first write command is generated. The data output from the buffer cell 140 are selected by the input multiplexer 150 when the next write command occurs, and the selected data are stored in the memory cell array 170.

In a data read operation, the selecting circuit 160 selects either the buffer data DID1, DID2, DID3 and DID4 or the memory data pairs SGI01/B, SGI02/B, SGI03/B and SGI04/B in response to a selecting signal TODIOE. In case of reading the data stored in the memory cell array 170, the selecting circuit 160 causes the buffer data DID1, DID2, DID3 and DID4 not to be output to the main input/output line pairs MI01/B, MI02/B, MI03/B and MI04/B. In case of reading the data stored in the buffer cell 140, the selecting circuit 160 outputs the buffer data DID1, DID2, DID3 and DID4 to the main input/output line pairs MI01/B, MI02/B, MI03/B and MI04/B. The data pairs SAI1/B, SAI2/B, SAI3/B and SAI4/B output from the selecting circuit 160 are amplified by the I/O sense amplifier 180. The amplified data pairs SAI1/B, SAI2/B, SAI3/B and SAI4/B are selected by the output multiplexer 190 to be output through the output buffer 200.

When data are read from the memory cell array 170 and read from the buffer cell 140, the semiconductor memory device according to the present invention shown in FIG. 2 may output the read data through a same path, namely, through the I/O sense amplifier 180, by employing the selecting circuit 160. Thus, when the data stored in the buffer cell 140 are output, the semiconductor memory device does not require the reordering circuit used in the conventional device because the I/O sense amplifier 180 has a data reordering function, that is, since the semiconductor memory device does not require a reordering circuit, wires and tri-state buffers that are typically connected to the reordering circuit, an overall chip size of the semiconductor memory device of a semiconductor integrated circuit may be reduced. Furthermore, in case the data input/out constitution of the semiconductor memory device according to the present invention is employed, the precision of a timing circuit for the semiconductor memory device may be enhanced when the timing circuit is designed because the same path is used when the data in the memory cell array and the data in the buffer cell are read-out.

Figure 3:
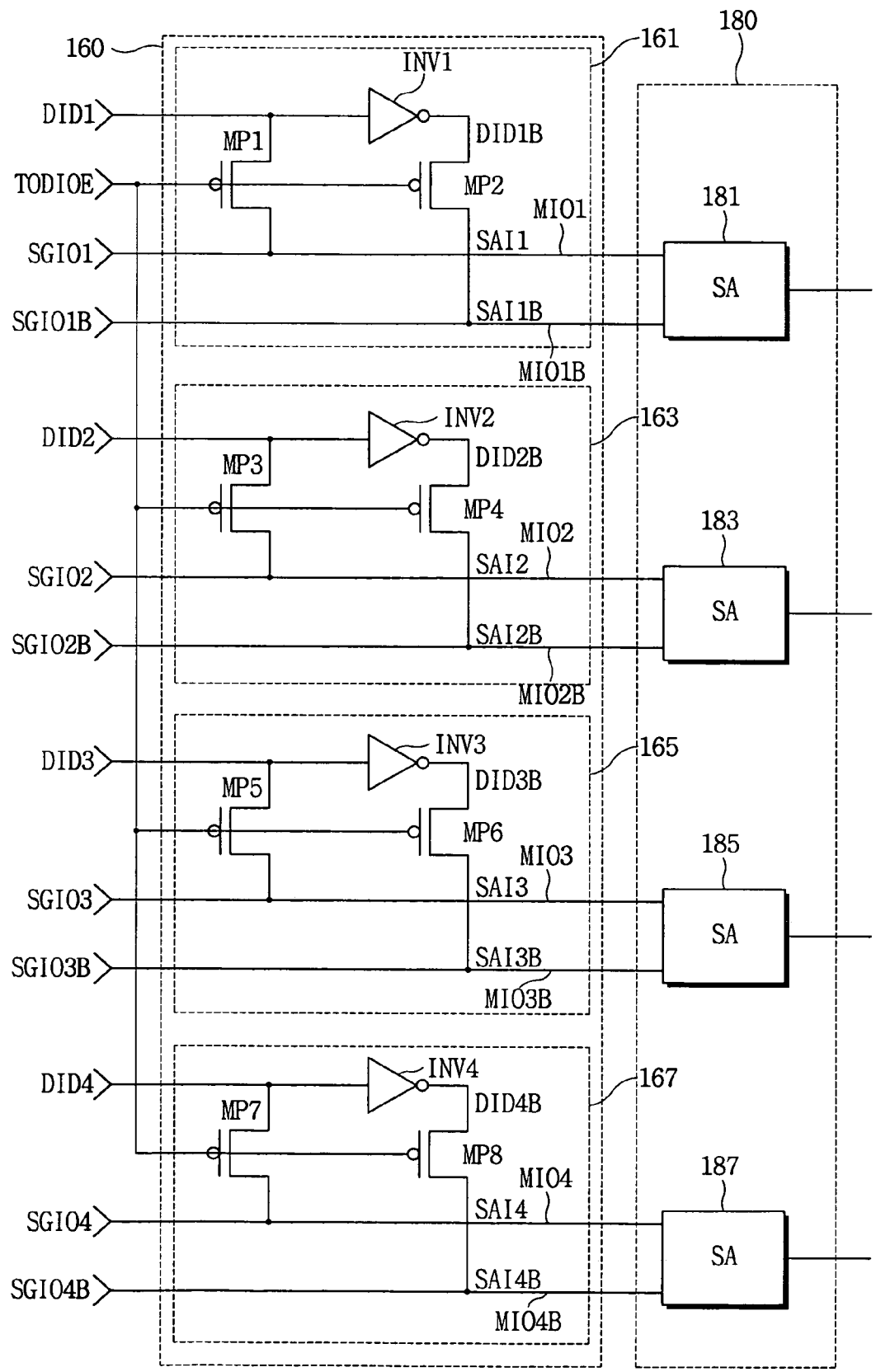
FIG. 3 is a circuit diagram of the selecting circuit and the I/O sense amplifier shown in FIG. 2.

FIG. 3 is a circuit diagram of an exemplary implementation of the selecting circuit and the I/O sense amplifier shown in FIG. 2. Referring to FIG. 3, the number of the selecting circuit and the I/O sense amplifiers corresponds to the number of the main input/output line pairs MI01/B, MI02/B, MI03/B and MI04/B. The selecting circuit 160 includes first, second, third and fourth selecting parts 161, 163, 165 and 167 configured to select the data DID1, DID2, DID3 and DID4 output from the input multiplexer 150 or the memory data pairs SGI01/B, SGI02/B, SGI03/B and SGI04/B output from the memory cell array 170 in response to the selecting signal TODIOE to output the selected data to the main input/output line pairs MI01/B, MI02/B, MI03/B and MI04/B. The I/O sense amplifier 180 includes first, second, third and fourth sense amplifiers 181, 183, 185 and 187 that amplify output data pairs SAI1 and SAI1B, SAI2 and SAI2B, SAI3 and SAI3B and SAI4 and SAI4B output from each of the first, second, third and fourth selecting parts 161, 163, 165 and 167.

The first selecting part 161 includes a first PMOS transistor MP1, a first inverter INV1 and a second PMOS transistor MP2. The first PMOS transistor MP1 outputs a first bit DID1 of the data DID1, DID2, DID3 and DID4 to a first line MIO1 of a first main input/output line pair MI01 and MI01B in response to the selecting signal TODIOE. The first inverter INV1 inverts the first bit DID1 of the data DID1, DID2, DID3 and DID4. The second PMOS transistor MP2 outputs the output data DID1B from the first inverter INV1 to a second line MI01B of the first main input/output line pair MI01 and MI01B in response to the selecting signal TODIOE. In addition, a first bit SGI01 of a first bit pair SGI01 and SGI01B of the memory data pairs SGI01/B, SGI02/B, SGI03/B and SGI04/B is input into the first line MI01 of the first main input/output line pair MI01 and MI01B, and a second bit SGI01B of the first bit pair SGI01 and SGI01B of the memory data pairs SGI01/B, SGI02/B, SGI03/B and SGI04/B is input into the second line MI01B of the first main input/output line pair MI01 and MI01B.

The second selecting part 163 includes a third PMOS transistor MP3, a second inverter INV2 and a fourth PMOS transistor MP4. The third PMOS transistor MP3 outputs a second bit DID2 of the data DID1, DID2, DID3 and DID4 to a first line MI02 of a second main input/output line pair MI02 and MI01B in response to the selecting signal TODIOE. The second inverter INV2 inverts the second bit DID2 of the data DID1, DID2, DID3 and DID4. The fourth PMOS transistor MP4 outputs the output data DID2B from the second inverter INV2 to a second line MI02B of the second main input/output line pair MI02 and MI02B in response to the selecting signal TODIOE. In addition, a first bit SGI02 of a second bit pair SGI02 and SGI02B of the memory data pairs SGI01/B, SGI02/B, SGI03/B and SGI04/B is input into the first line MI02 of the second main input/output line pair MI02 and MI02B, and a second bit SGI02B of the second bit pair SGI02 and SGI02B of the memory data pairs SGI01/B, SGI02/B, SGI03/B and SGI04/B is input into the second line MI02B of the second main input/output line pair MI02 and MI02B.

The third selecting part 165 includes a fifth PMOS transistor MP5, a third inverter INV3 and a sixth PMOS transistor MP6. The fifth PMOS transistor MP5 outputs a third bit DID3 of the data DID1, DID2, DID3 and DID4 to a first line MI03 of a third main input/output line pair MI03 and MI03B in response to the selecting signal TODIOE. The third inverter INV3 inverts the third bit DID3 of the data DID1, DID2, DID3 and DID4. The sixth PMOS transistor MP6 outputs the output data DID3B from the third inverter INV3 to a second line MI03B of the third main input/output line pair MI03 and MI03B in response to the selecting signal TODIOE. Also, a first bit SGI03 of a third bit pair SGI03 and SGI03B of the memory data pairs SGI01/B, SGI02/B, SGI03/B and SGI04/B is input into the first line MI03 of the third main input/output line pair MI03 and MI03B, and a second bit SGI03B of the third bit pair SGI03 and SGI03B of the memory data pairs SGI01/B, SGI02/B, SGI03/B and SGI04/B is input into the second line MI03B of the third main input/output line pair MI03 and MI03B.

The fourth selecting part 167 includes a seventh PMOS transistor MP7, a fourth inverter INV4 and an eighth PMOS transistor MP8. The seventh PMOS transistor MP7 outputs a fourth bit DID4 of the data DID1, DID2, DID3 and DID4 to a first line MI04 of a fourth main input/output line pair MI04 and MI04B in response to the selecting signal TODIOE. The fourth inverter INV4 inverts the fourth bit DID4 of the data DID1, DID2, DID3 and DID4. The eighth PMOS transistor MP8 outputs the output data DID4B from the fourth inverter INV4 to a second line MI04B of the fourth main input/output line pair MI04 and MI04B in response to the selecting signal TODIOE. In addition, a first bit SGI04 of a fourth bit pair SGI04 and SGI04B of the memory data pairs SGI01/B, SGI02/B, SGI03/B and SGI04/B is input into the first line MI04 of the fourth main input/output line pair MI04 and MI04B, and a second bit SGI04B of the fourth bit pair SGI04 and SGI04B of the memory data pairs SGI01/B, SGI02/B, SGI03/B and SGI04/B is input into the second line MI04B of the fourth main input/output line pair MI04 and MI0B.

Hereinafter, operation of the selecting circuit 160 shown in FIG. 3 will be described in detail. In reading out the data from the memory cell array 170, the selecting signal TODIOE becomes in a logic high state and the first to eighth PMOS transistors MP1, MP2, MP3, MP4, MP5, MP6, MP7 and MP8 are turned off, so that the data DID1, DID2, DID3 and DID4 is not provided to the main input/output line pairs MI01/B, MI02/B, MI03/B and MI04/B. The memory data pairs SGI01/B, SGI02/B, SGI03/B and SGI04/B are provided to the main input/output line pairs MI01/B, MI02/B, MI03/B and MI04/B. In reading out the data from the buffer cell 140, the selecting signal TODIOE transitions to a logic low state and the first to eighth PMOS transistors MP1, MP2, MP3, MP4, MP5, MP6, MP7 and MP8 are turned on, so that the data DID1, DID2, DID3 and DID4 and the inverted data DID1B, DID2B, DID3B and DID4B are provided to the main input/output line pairs MI01/B, MI02/B, MI03/B and MI04/B.

Figure 4:
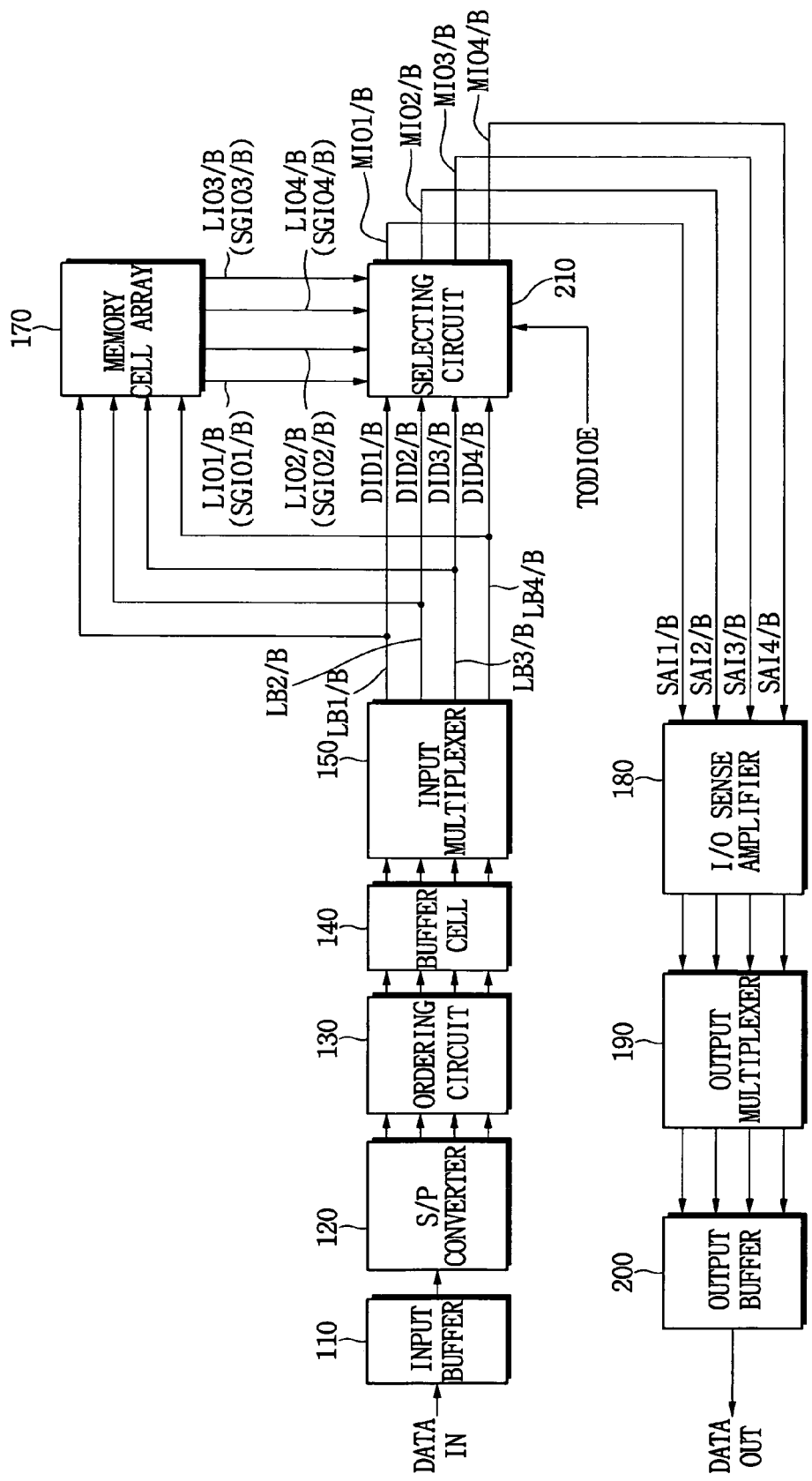
FIG. 4 is a block diagram showing input/output paths of a DRAM device having a late write function according to further exemplary embodiments of the present invention.

FIG. 4 is a block diagram showing an input/output path of a DRAM device having the late write function according to other exemplary embodiments of the present invention. Comparing the DRAM device shown in FIG. 4 to the DRAM device shown in FIG. 2, these devices differ in that the data output through the input multiplexer 150 from the buffer cell 140 includes data pair having non-inverted data and inverted data DID1 and DID1B, DID2 and DID2B, DID3 and DID3B and DID4 and DID4B. In addition, the buffer output line includes buffer output line pairs, each pair including a non-inverted line and inverted line represented as LB1 and LB1B, LB2 and LB2B, LB3 and LB3B and LB4 and LB4B. In FIG. 4, the buffer data pairs are represented by DID1/B, DID2/B, DID3/B and DID4/B and the buffer output line pairs are represented by LB1/B, LB2/B, LB3/B and LB4/B. In FIG. 4, a selecting circuit 210 selectively outputs the data pairs DID1/B, DID2/B, DID3/B and DID4/B or the memory data pairs SGI01/B, SGI02/B, SGI03/B and SGI04/B to the main input/output line pairs MI01/B, MI02/B, MI03/B and MI04/B in response to the selecting signal TODIOE during the read operation. Because operation of the semiconductor memory device shown in FIG. 4 is almost same as that of the semiconductor memory device shown in FIG. 2, further detailed explanation of operations thereof will be omitted in light of the foregoing description of FIGS. 2 and 3.

Figure 5:
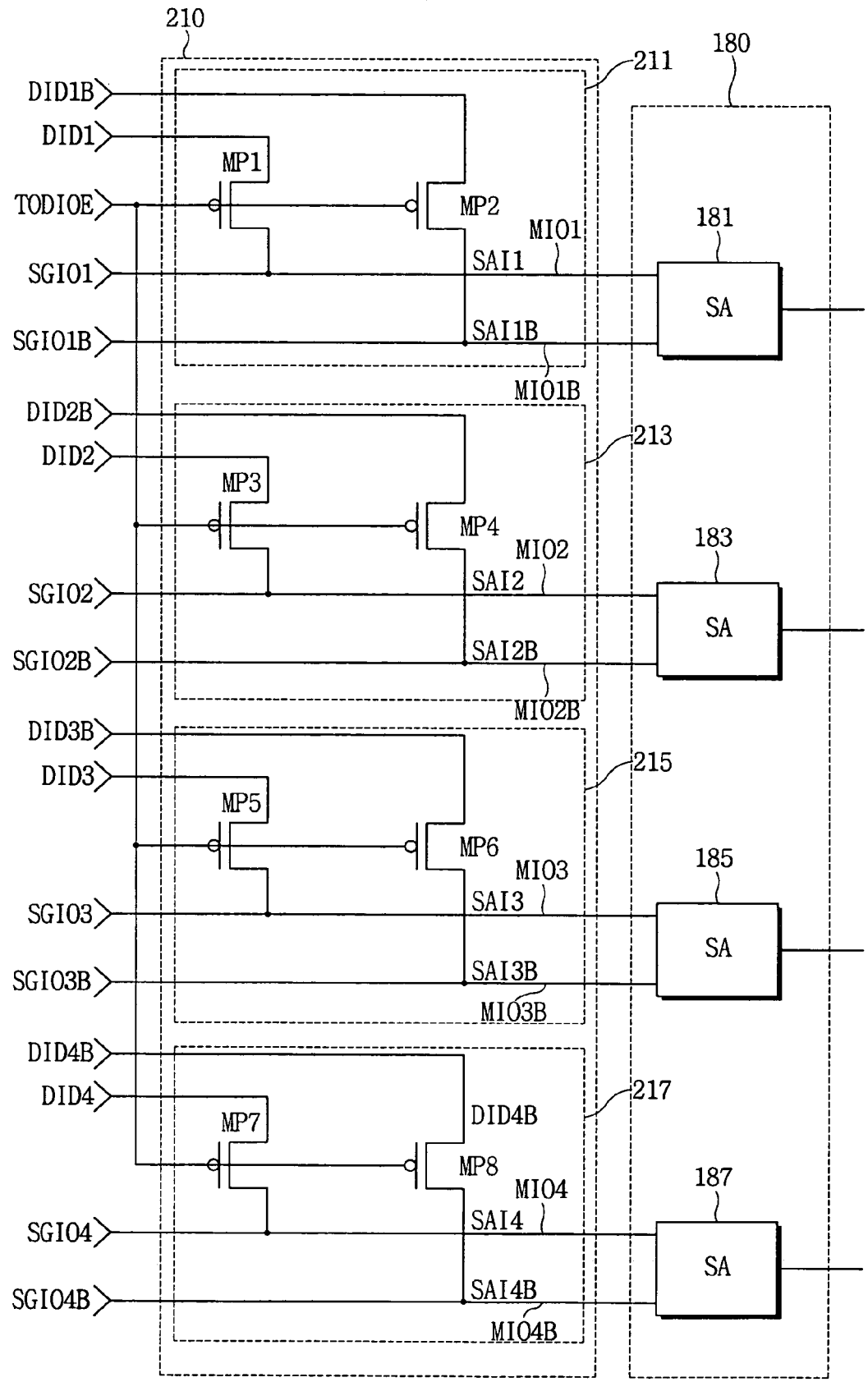
FIG. 5 is a circuit diagram of the selecting circuit and the I/O sense amplifier shown in FIG. 4.

FIG. 5 is a circuit diagram of the selecting circuit and the I/O sense amplifier shown in FIG. 4. Referring to FIG. 5, the number of selecting circuits 210 and I/O sense amplifiers 180 corresponds to the number of the main input/output line pairs MI01/B, MI02/B, MI03/B and MI04/B. The selecting circuit 210 includes first, second, third and fourth selecting parts 211, 213, 215 and 217 configured to select the data pairs DID1/B, DID2/B, DID3/B and DID4/B output from the input multiplexer 150 or the memory data pairs SGI01/B, SGI02/B, SGI03/B and SGI04/B output from the memory cell array 170 in response to the selecting signal TODIOE to output the selected data to the main input/output line pairs MI01/B, MI02/B, MI03/B and MI04/B. The I/O sense amplifier 180 includes first, second third and fourth sense amplifiers 181, 183, 185 and 187 configured to amplify output data pairs SAI1 and SAI1B, SAI2 and SAI2B, SAI3 and SAI3B and SAI4 and SAI4B output from each of the first, second, third and fourth selecting parts 211, 213, 215 and 217.

The first selecting part 211 includes a first PMOS transistor MP1 and a second PMOS transistor MP2. The first PMOS transistor MP1 outputs a first bit DID1 of a first bit pair DID1 and DID1B of the data pairs DID1/B, DID2/B, DID3/B and DID4/B to a first line MI01 of a first main input/output line pair MI01 and MI01B in response to the selecting signal TODIOE. The second PMOS transistor MP2 outputs a second bit DID1B of the first bit pair DID1 and DID1B of the data pairs DID1/B, DID2/B, DID3/B and DID4/B to a second line MI01B of the first main input/output line pair MI01 and MI01B in response to the selecting signal TODIOE. In addition, a first bit SGI01 of a first bit pair SGI01 and SGI01B of the memory data pairs SGI01/B, SGI02/B, SGI03/B and SGI04/B is input into the first line MI01 of the first main input/output line pair MI01 and MI01B, and a second bit SGI01B of the first bit pair SGI01 and SGI01B of the memory data pairs SGI01/B, SGI02/B, SGI03/B and SGI04/B is input into the second line MI01B of the first main input/output line pair MI01 and MI01B.

The second selecting part 213 includes a third PMOS transistor MP3 and a fourth PMOS transistor MP4. The third PMOS transistor MP3 outputs a first bit DID2 of a second bit pair DID2 and DID2B of the data pairs DID1/B, DID2/B, DID3/B and DID4/B to a first line MI02 of a second main input/output line pair MI02 and MI02B in response to the selecting signal TODIOE. The fourth PMOS transistor MP4 outputs a second bit DID2B of the second bit pair DID2 and DID2B of the data pairs DID1/B, DID2/B, DID3/B and DID4/B to a second line MI02B of the second main input/output line pair MI02 and MI02B in response to the selecting signal TODIOE. In addition, a first bit SGI02 of a second bit pair SGI02 and SGI02B of the memory data pairs SGI01/B, SGI02/B, SGI03/B and SGI04/B is input into the first line MI02 of the second main input/output line pair MI02 and MI02B, and a second bit SGI02B of the second bit pair SGI02 and SGI02B of the memory data pairs SGI01/B, SGI02/B, SGI03/B and SGI04/B is input into the second line MI02B of the second main input/output line pair MI02 and MI02B.

The third selecting part 215 includes a fifth PMOS transistor MP5 and a sixth PMOS transistor MP6. The fifth PMOS transistor MP5 outputs a first bit DID3 of a third bit pair DID3 and DID3B of the data pairs DID1/B, DID2/B, DID3/B and DID4/B to a first line MI03 of a third main input/output line pair MI03 and MI03B in response to the selecting signal TODIOE. The sixth PMOS transistor MP6 outputs a second bit DID3B of the third bit pair DID3 and DID3B of the data pairs DID1/B, DID2/B, DID3/B and DID4/B to a second line MI03B of the third main input/output line pair MI03 and MI03B in response to the selecting signal TODIOE. In addition, a first bit SGI03 of a third bit pair SGI03 and SGI03B of the memory data pairs SGI01/B, SGI02/B, SGI03/B and SGI04/B is input into the first line MI03 of the third main input/output line pair MI03 and MI03B, and a second bit SGI03B of the third bit pair SGI03 and SGI03B of the memory data pairs SGI01/B, SGI02/B, SGI03/B and SGI04/B is input into the second line MI03B of the third main input/output line pair MI03 and MI03B.

The fourth selecting part 217 includes a seventh PMOS transistor MP7 and a eighth PMOS transistor MP8. The seventh PMOS transistor MP7 outputs a first bit DID4 of a fourth bit pair DID4 and DID4B of the data pairs DID1/B, DID2/B, DID3/B and DID4/B to a first line MI04 of a fourth main input/output line pair MI04 and MI04B in response to the selecting signal TODIOE. The eighth PMOS transistor MP8 outputs a second bit DID4B of the fourth bit pair DID4 and DID4B of the data pairs DID1/B, DID2/B, DID3/B and DID4/B to a second line MI04B of the fourth main input/output line pair MI04 and MI04B in response to the selecting signal TODIOE. In addition, a first bit SGI04 of a fourth bit pair SGI04 and SGI04B of the memory data pairs SGI01/B, SGI02/B, SGI03/B and SGI04/B is input into the first line MI04 of the fourth main input/output line pair MI04 and MI04B, and a second bit SGI04B of the fourth bit pair SGI04 and SGI04B of the memory data pairs SGI01/B, SGI02/B, SGI03/B and SGI04/B is input into the second line MI04B of the fourth main input/output line pair MI04 and MI04B.

Hereinafter, operation of the selecting circuit 210 shown in FIG. 5 will be described in detail. In reading out the data from the memory cell array 170, the selecting signal TODIOE has a logical high state and the first to eighth PMOS transistors MP1, MP2, MP3, MP4, MP5, MP6, MP7 and MP8 are turned off, so that the data pairs DID1/B, DID2/B, DID3/B and DID4/B are not provided to the main input/output line pairs MI01/B, MI02/B, MI03/B and MI04/B. The memory data pairs SGI01/B, SGI02/B, SGI03/B and SGI04/B are provided to the main input/output line pairs MI01/B, MI02/B, MI03/B and MI04/B. In reading out the data in the buffer cell 140, the selecting signal TODIOE has a logical low state and the first to eighth PMOS transistors MP1, MP2, MP3, MP4, MP5, MP6, MP7 and MP8 are turned on, so that the data pairs DID1/B, DID2/B, DID3/B and DID4/B are provided to the main input/output line pairs MI01/B, MI02/B, MI03/B and MI04/B.

According to some embodiments of the present invention, a semiconductor memory device may selectively read out data from the memory cell array or data from the buffer cell. In addition, the semiconductor memory device may read out the data from the memory cell array and the data from the buffer cell through the same path, so that the semiconductor memory device does not need a reordering circuit, wires connected to the reordering circuit and the tri-state buffers. As a result, chip size may be reduced. In addition, the precision of the timing circuit of the semiconductor memory device may be enhanced.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An integrated circuit memory device, comprising:
    a memory cell array;
    a plurality of data input lines configured to convey data to the memory cell array;
    a plurality of data output lines configured to convey data from the memory cell array;
    a memory write buffer that receives write data for the memory cell array and responsively drives the data input lines;
    a sense amplifier;
    a plurality of sense amplifier input lines configured to convey data to the sense amplifier; and
    a selecting circuit coupled to the data input lines, to the data output lines and to the sense amplifier input lines and configured to selectively couple the data input lines to the sense amplifier input lines responsive to a control signal.

2. A device according to claim 1, wherein the memory write buffer stores write data responsive to a first write command, and wherein the memory write buffer outputs the write data on the data input lines responsive to a second write command.

3. A device according to claim 1, wherein the data output lines and the sense amplifier lines comprise a plurality of signal line pairs extending from the memory cell array to the sense amplifier, and wherein the selecting circuit is configured to couple and decouple the data input lines to and from the plurality of signal line pairs.

4. A device according to claim 3, wherein the signal line pairs extending from the memory cell array to the sense amplifier comprise a first plurality of signal line pairs, wherein the data input lines comprise a second plurality of signal line pairs extending between the memory write buffer and the memory cell array, and wherein the selecting circuit is configured to couple and decouple single signal lines of respective ones of the second plurality of signal line pairs to and from the first plurality of signal line pairs.

5. A memory device according to claim 4, wherein the selecting circuit comprises:
    a first transistor configured to couple and decouple a signal line of the second plurality of signal lines to and from a first signal line of a pair of signal lines of the first plurality of signal line pairs;
    a second transistor configured to couple and decouple the signal line of the second plurality of signal lines to and from a second signal line of the pair of signal lines of the first plurality of signal line pairs; and
    an inverter configured to be coupled by the second transistor between the signal line of the second plurality of signal lines and the second signal line of the pair of signal lines of the first plurality of signal line pairs.

6. A memory device according to claim 3, wherein the selecting circuit comprises:
    a first transistor configured to couple and decouple a first signal line of the second plurality of signal lines to and from a first signal line of a pair of signal lines of the first plurality of signal line pairs; and
    a second transistor configured to couple and decouple a second signal line of the second plurality of signal lines to and from a second signal line of the pair of signal lines of the first plurality of signal line pairs.

7. A method of operating an integrated circuit memory device comprises a memory cell array that provides data to a sense amplifier via sense amplifier input lines and a memory write buffer that drives data input lines to the memory cell array, the method comprising:
    selectively coupling the data input lines to the sense amplifier input lines responsive to a control signal.

8. A method according to claim 7, further comprising storing write data in the memory write buffer responsive to a first write command, and outputting the stored data on the data input lines responsive to a second write command.

9. A method according to claim 7, wherein the data output lines and the sense amplifier lines comprise a plurality of signal line pairs extending from the memory cell array to the sense amplifier, and wherein selectively coupling the data input lines to the sense amplifier input lines responsive to a control signal comprises coupling and decoupling the data input lines to and from the plurality of signal line pairs.

10. A method according to claim 9, wherein the signal line pairs extending from the memory cell array to the sense amplifier comprise a first plurality of signal line pairs, wherein the data input lines comprise a second plurality of signal line pairs extending between the memory write buffer and the memory cell array, and wherein coupling and decoupling the data input lines to and from the plurality of signal line pairs comprises coupling and decoupling single signal lines from respective ones of the second plurality of signal line pairs to and from respective ones of the first plurality of signal line pairs.

11. A method according to claim 9, wherein the signal line pairs extending from the memory cell array to the sense amplifier comprise a first plurality of signal line pairs, wherein the data input lines comprise a second plurality of signal line pairs extending between the memory write buffer and the memory cell array, and wherein coupling and decoupling the data input lines to and from the plurality of signal line pairs comprises coupling and decoupling respective ones of the second plurality of signal line pairs to and from respective ones of the first plurality of signal line pairs.

* * * * *